United States Patent
Han et al.

(10) Patent No.: US 6,312,987 B1
(45) Date of Patent: Nov. 6, 2001

(54) METHOD FOR MANUFACTURING SEMICONDUCTOR DEVICE HAVING HEMISPHERICAL GRAIN POLYSILICON FILM

(75) Inventors: Chan-hee Han, Suwon; Young-ho Kang, Pyungtaek; Chang-jip Yang, Suwon; Young-kyou Park, Seoul, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/071,681

(22) Filed: May 1, 1998

(30) Foreign Application Priority Data

May 3, 1997 (KR) .................................. 97-17192

(51) Int. Cl.$^7$ .............................................. H01L 21/8242
(52) U.S. Cl. ........................................... 438/255; 438/398
(58) Field of Search ................................ 438/253–256, 438/393–399

(56) References Cited

U.S. PATENT DOCUMENTS

| 5,366,917 | 11/1994 | Watanabe et al. ................. 47/437 |
| 5,385,863 | * | 1/1995 | Tatsumi et al. . |
| 5,656,531 | 8/1997 | Thakur et al. ..................... 398/438 |
| 5,723,379 | 3/1998 | Watanabe et al. ................. 398/438 |
| 5,960,281 | * | 9/1999 | Nam et al. ......................... 438/255 |

OTHER PUBLICATIONS

Korean App. No. 97–18042, Issued Apr. 30, 1997, Filed Sep. 25, 1995, to Yoon–Ki Kim.

* cited by examiner

Primary Examiner—Jey Tsai

(57) ABSTRACT

A method for forming a hemispherical grain polysilicon layer on an amorphous silicon film increases the surface area of the layer by first forming silicon crystal nuclei on the film, and then enlarging the nuclei before annealing. The nuclei are formed on the amorphous silicon film loading a substrate having the amorphous silicon film into a chamber and injecting a silicon source gas into the chamber at a first, low flow rate which allows the pressure of the chamber to be reduced, thereby increasing the density of the crystal nuclei. A silicon source gas is then injected into the chamber at a second, higher flow rate, thereby enlarging the silicon crystal nuclei on the amorphous layer. The resulting structure is then annealed to form a hemispherical grain polysilicon layer having a large surface area due to the irregular surface of the polysilicon layer. A dielectric layer is then formed on the polysilicon layer, and an impurity-doped polycrystaline silicon layer is deposited over the dielectric layer to form a capacitor.

18 Claims, 3 Drawing Sheets

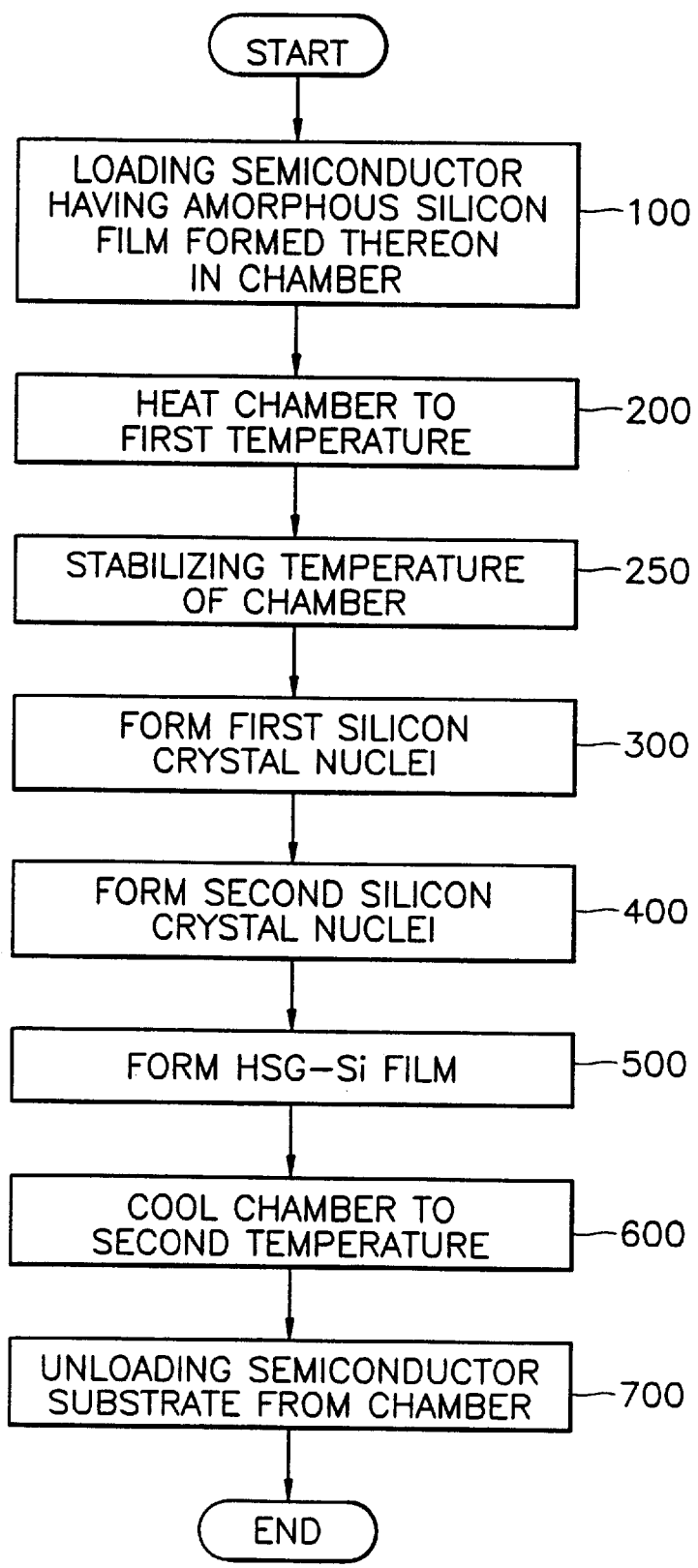

METHOD FOR MANUFACTURING SEMICONDUCTOR DEVICE HAVING HEMISPHERICAL GRAIN POLYSILICON FILM

This application corresponds to Korean patent application No. 97-17192 filed May 3, 1997 in the name of Samsung Electronics Co., Ltd., which is herein incorporated by reference for all purposes.

BACKGROUND OF THE INVENTION

1. Field of the Invention

This invention relates generally to semiconductor devices, and more particularly to a method for manufacturing having a layer of hemispherical grain polysilicon (referred to herein as "HSG-Si" for use as a capacitor electrode

2. Description of the Related Art

In a dynamic random access memory (DRAM) device, an increase in cell capacitance improves the reading operation of a memory cell and reduces the soft error rate. This greatly improves the operational characteristics of the memory cell. However, as the integration level of semiconductor device increases, the chip area available for each unit memory cell decreases, thereby resulting in a reduction in the area available for each cell capacitor. Therefore, it is necessary to increase the cell capacitance per a unit area to maintain adequate performance at increased integration levels.

Accordingly, much research into methods for increasing the cell capacitance has been conducted. Most of the research has concentrated on modifying the structure of the lower electrodes of cell capacitors. Examples of modified structures that have been proposed are a fin structure, a box structure or a cylindrical structure.

However, increasing the cell capacitance by changing the structure of the lower electrode of the cell capacitors has drawbacks due to a limited design-rule and an increased soft error rate caused by the complicated manufacturing processes required to realize these structures.

Accordingly, a need remains for an improved technique for increasing the capacitance of unit cell capacitors in a semiconductor memory device.

SUMMARY OF THE INVENTION

Therefore, it is an object of the present invention to increase the capacitance of unit cell capacitors in a semiconductor device.

Another object of the present invention is to provide an improved method for manufacturing a semiconductor device having a lower electrode using an HSG-Si layer.

A further object of the present invention is to simplify the fabrication of a semiconductor device having a capacitor that includes an HSG-Si layer.

To accomplish these and other objects, a method for forming a hemispherical grain polysilicon layer on an amorphous silicon film increases the surface area of the layer by first forming silicon crystal nuclei on the film, and then enlarging the nuclei before annealing. The nuclei are formed on the amorphous silicon film loading a substrate having the amorphous silicon film into a chamber and injecting a silicon source gas into the chamber at a first, low flow rate which allows the pressure of the chamber to be reduced, thereby increasing the density of the crystal nuclei. A silicon source gas is then injected into the chamber at a second, higher flow rate, thereby enlarging the silicon crystal nuclei on the amorphous layer. The resulting structure is then annealed to form a hemispherical grain polysilicon layer having a large surface area due to the irregular surface of the polysilicon layer. A dielectric layer is then formed on the polysilicon layer, and an impurity-doped polycrystaline silicon layer is deposited over the dielectric layer to form a capacitor.

One aspect of the present invention is a method for manufacturing a semiconductor device comprising: forming an impurity-doped amorphous silicon layer on a semiconductor substrate; loading the semiconductor substrate into a chamber; injecting a first amount of silicon source gas into the chamber, thereby forming silicon crystal nuclei on the amorphous silicon layer; injecting a second amount of silicon source gas into the chamber, thereby enlarging the silicon crystal nuclei; and annealing the semiconductor substrate, amorphous silicon layer, and silicon crystal nuclei, thereby forming a hemispherical grain polysilicon layer. Injecting a first amount of silicon source gas into the chamber can include injecting silicon source gas into the chamber at a first flow rate, while injecting a second amount of silicon source gas into the chamber includes injecting silicon source gas into the chamber at a second flow rate that is higher than the first flow rate.

Another aspect of the present invention is a method for manufacturing a semiconductor device comprising: loading a semiconductor substrate having an impurity-doped amorphous silicon film into a chamber; heating the semiconductor substrate to a first temperature; injecting a first amount of silicon source gas into the chamber to selectively form first silicon crystal nuclei on the amorphous silicon film; injecting a second amount of silicon source gas into the chamber, thus forming second silicon crystal nuclei larger than the first silicon crystal nuclei; annealing the resultant structure to grow the second silicon crystal nuclei, thus forming a hemispherical grain polysilicon film; and cooling the chamber to a second temperature lower than the first temperature. Injecting a first amount of silicon source gas into the chamber can include injecting silicon source gas into the chamber at a first flow rate, while injecting a second amount of silicon source gas into the chamber includes injecting silicon source gas into the chamber at a second flow rate that is higher than the first rate. The method further includes forming a dielectric layer over the hemispherical grain polysilicon film and forming an electrode layer of the dielectric layer. In a preferred implementation, the first temperature is about 500 to 590 degrees C., and the first amount of silicon source gas is about 60 to 90 percent of the second amount of silicon source gas.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIG. 6 is a flow diagram for illustrating the steps of forming an HSG-Si layer on a semiconductor device in accordance with the present invention.

DETAILED DESCRIPTION

A method for forming a capacitor for a semiconductor device in accordance with the present invention will now be described with reference to FIGS. 1–5.

Figure 1:
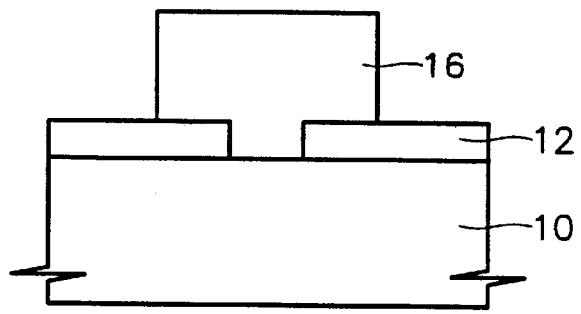
FIG. 1 is drawing showing a cross-sectional view for illustrating the step of forming an amorphous silicon film on a semiconductor substrate in accordance with the present invention.

FIG. 1 shows the step of forming an amorphous silicon film 16 on a semiconductor substrate 10 in accordance with the present invention. Referring to FIG. 1, an insulating layer 12, e.g., a silicon oxide layer, is formed on a semiconductor substrate 10, and a contact hole for contacting an active region of the semiconductor substrate 10 is formed in the oxide layer. Next, an amorphous silicon layer 16 is buried in, and formed over, the contact hole. Then, impurities such as fluorine are ion-implanted into the amorphous silicon layer 16 which is used as the lower electrode of a capacitor in the semiconductor device.

Figure 2:
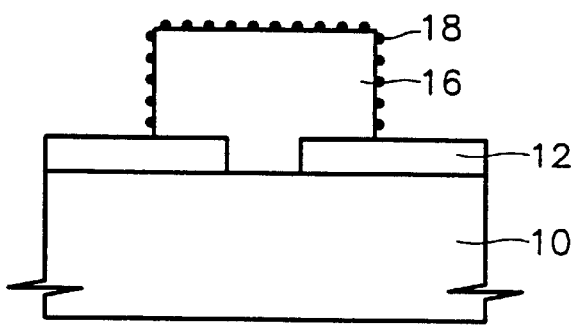
FIG. 2 is a drawing showing a cross-sectional view for illustrating a step for selectively forming first silicon crystal nuclei on the amorphous silicon film of FIG. 1 in accordance with the present invention.

FIG. 2 shows a seeding step for selectively forming first silicon crystal nuclei 18 on the amorphous silicon film 16. The semiconductor substrate 10, on which the impurity-doped amorphous silicon layer 16 is formed, is loaded into the chamber of a low pressure chemical vapor deposition (LPCVD) apparatus. Then, a silicon source gas, e.g., $SiH_4$ or $Si_2H_6$ gas, is injected into the chamber at a first flow rate of 80 SCCM (standard cubic centimeters per minutes), a pressure of $10^{-1}$ torr to $10^{-3}$ torr, and a temperature of 550 to 590°, thereby selectively forming the first silicon crystal nuclei 18 on the amorphous silicon layer 16.

Figure 3:
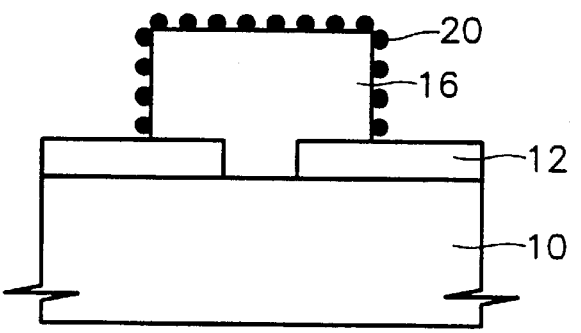
FIG. 3 is a drawing showing a cross-sectional view for illustrating the step of enlarging the first silicon crystal nuclei of FIG. 2 in accordance with the present invention.

FIG. 3 shows a step of forming second silicon crystal nuclei 20. Specifically, while the semiconductor substrate 10 having the first silicon crystal nuclei 18 formed thereon is still in the chamber, more silicon source gas, e.g., $SiH_4$ or $Si_2H_6$ gas, is injected into the chamber at a second, higher, flow rate, e.g., 100 SCCM, at a pressure of $10^{-1}$ torr to $10^{-3}$ torr and a temperature of 550 to 590°, thus forming the second silicon crystal nuclei 20 by enlarging the first silicon crystal nuclei 18 formed on the amorphous silicon layer 16.

The first amount, i.e., first flow rate, of the silicon source gas used for forming the first silicon crystal nuclei 18 is lower than the second amount, i.e., second flow rate, of the source gas. For example, the first amount is about 60% to 90% of the second amount. The silicon source gas is reduced during formation of the first silicon crystal nuclei 18 so that the pressure of the chamber can be further lowered, thereby increasing the density of the first silicon crystal nuclei 18. The first silicon crystal nuclei 18 are selectively formed only on the amorphous silicon layer 16 due to the difference in the incubation time at the early stage of silicon deposition caused by the difference in the surface energy and surface state between the amorphous silicon layer 16 and the insulating layer 12.

Figure 4:
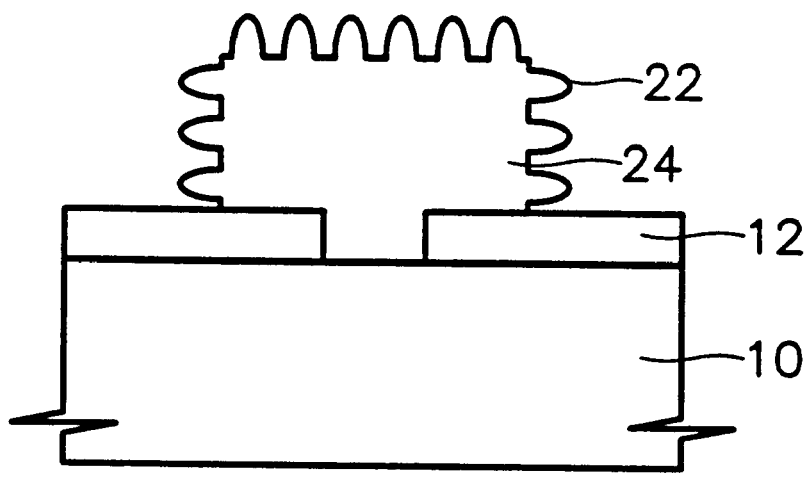
FIG. 4 is a drawing showing a cross-sectional view for illustrating the step of forming an HSG-Si layer having hemispherical grains in accordance with the present invention.

FIG. 4 shows the step of forming an HSG-Si layer 24 having hemispherical grains 22. More specifically, an annealing process is performed on the resultant structure at 550 to 590° C. to grow the second silicon crystal nuclei 20, thereby forming the hemispheric grains 22 and simultaneously recrystallizing the amorphous silicon layer 16. During this step, the second silicon crystal nuclei 20 grow because they are provided with silicon from the amorphous silicon layer 16. Thus, the HSG-Si layer 24, which is used as the lower electrode of a capacitor in a semiconductor device, is formed on the semiconductor substrate 10.

The HSG-Si layer 24 is formed using a special physical phenomenon occurring during the phase transition of amorphous silicon into polycrystalline silicon. When heat is applied after depositing amorphous silicon on the substrate, the amorphous silicon is transformed into intermediate polycrystalline silicon having a irregular surface by forming fine hemispherical grains. Through this transformation, the irregular surface increases the surface area by two or three times compared to an even surface.

Figure 5:
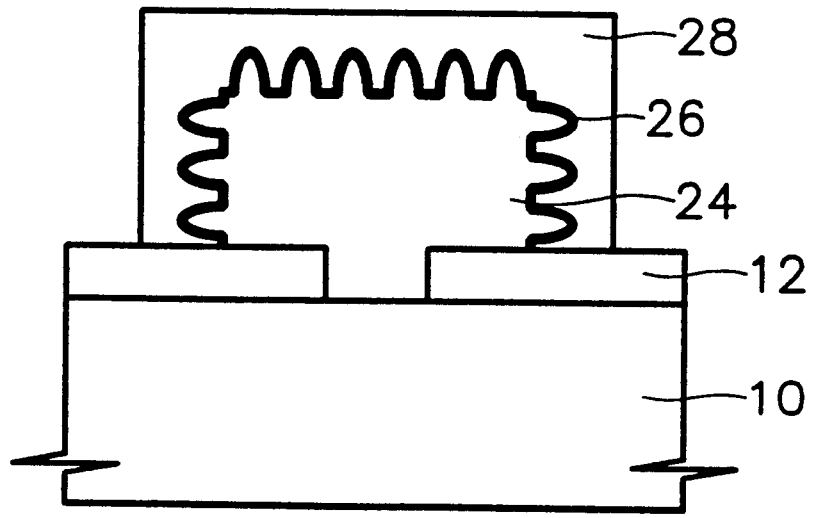
FIG. 5 is a drawing showing a cross-sectional view for illustrating the steps of forming a dielectric layer and a polycrystalline silicon layer on the HSG-Si layer of FIG. 4 in accordance with the present invention.

FIG. 5 shows the steps of forming a dielectric layer 26 and a polycrystalline silicon layer 28. More specifically, the dielectric film 26, e.g., nitride-oxide (NO) film, is formed on the HSG-Si layer 24. Then, an electrode layer of a material such as impurity-doped polycrystalline silicon 28 is formed on the dielectric layer 26. The impurity-doped polycrystalline silicon layer is used as the upper electrode of a capacitor in the semiconductor device.

A method for forming a HSG-Si layer in accordance with the present invention will now be described in more detail with reference to FIG. 6.

FIG. 6 is a flowchart outlining the steps of forming HSG-Si layer in a semiconductor device according to the present invention. First, at step 100, a semiconductor substrate on which an impurity-doped amorphous silicon film is formed is loaded in a chamber maintained at a temperature of 400 to 500° C. Then, the semiconductor substrate is heated to a first temperature of 500 to 590° C., in step 200. Next, in step 250, the temperature of the chamber is stabilized at the first temperature for a predetermined time.

Next, the silicon source gas is injected into the chamber at the first flow rate, thus selectively forming first silicon crystal nuclei on the amorphous silicon film, in step 300. Then, the silicon source gas is injected at a second, higher flow rate, into the chamber, thereby forming second silicon crystal nuclei, which are larger than the first silicon crystal nuclei, in step 400.

Thereafter, the semiconductor substrate having the second silicon crystal nuclei formed thereon is annealed, thereby growing the second silicon crystal nuclei and simultaneously forming a polycrystalline silicon layer by recrystallizing the amorphous silicon layer. Thus, in step 500, the HSG-Si layer is formed on the semiconductor substrate 10. The chamber is then cooled to a second temperature which is lower than the first temperature, e.g., 400 to 500° C., in step 600. Finally, the cooled substrate is unloaded from the chamber in step 700.

In accordance with the present invention, the silicon crystal nuclei are formed in two steps so that the density of the silicon crystal nuclei is enhanced and the cell capacitance is thus improved. In other words, the first silicon crystal nuclei are formed at higher density under lower pressure by injecting a smaller amount of source gas than that used to form the second silicon crystal nuclei. The first silicon crystal nuclei are enlarged by injecting a greater amount of source gas than that used to form the first silicon crystal nuclei, thereby forming larger silicon crystal nuclei. Thus, the surface area of the dielectric layer can be increased by the HSG-Si layer, thereby improving the capacitance of a cell capacitor that utilizes an amorphous silicon layer constructed according to the present invention as the lower electrode of a capacitor in the semiconductor device.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A method for manufacturing a semiconductor device comprising:

forming an impurity-doped amorphous silicon layer on a semiconductor substrate;

loading the semiconductor substrate into a chamber;

injecting a first amount of silicon source gas into the chamber, thereby forming silicon crystal nuclei on the amorphous silicon layer;

injecting a second amount of silicon source gas into the chamber, thereby enlarging the silicon crystal nuclei; and annealing the semiconductor substrate, amorphous silicon layer, and silicon crystal nuclei, thereby forming a hemispherical grain polysilicon layer.

2. A method according to claim 1 wherein injecting a first amount of silicon source gas into the chamber includes injecting silicon source gas into the chamber at a first flow rate.

3. A method according to claim 2 wherein injecting a second amount of silicon source gas into the chamber includes injecting silicon source gas into the chamber at a second flow rate.

4. A method according to claim 1 further including forming a dielectric layer over the hemispherical grain polysilicon layer.

5. A method according to claim 4 further including forming an electrode layer of the dielectric layer.

6. A method according to claim 1 wherein the silicon crystal nuclei are formed and enlarged at a temperature of about 500 to 590 degrees C.

7. A method according to claim 1 wherein the semiconductor substrate, amorphous silicon layer, and silicon crystal nuclei are annealed at a temperature of about 550 to 590 degrees C.

8. A method according to claim 1 wherein the first amount of silicon source gas is about 60 to 90 percent of the second amount of silicon source gas.

9. A method for manufacturing a semiconductor device comprising:

loading a semiconductor substrate having an impurity-doped amorphous silicon film into a chamber;

heating the semiconductor substrate to a first temperature;

injecting a first amount of silicon source gas into the chamber to selectively form first silicon crystal nuclei on the amorphous silicon film;

injecting a second amount of silicon source gas into the chamber, thus forming second silicon crystal nuclei larger than the first silicon crystal nuclei;

annealing the resultant structure to grow the second silicon crystal nuclei, thus forming a hemispherical grain polysilicon film; and cooling the chamber to a second temperature lower than the first temperature.

10. A method according to claim 9 wherein injecting a first amount of silicon source gas into the chamber includes injecting silicon source gas into the chamber at a first flow rate.

11. A method according to claim 10 wherein injecting a second amount of silicon source gas into the chamber includes injecting silicon source gas into the chamber at a second flow rate.

12. A method according to claim 9 further including forming a dielectric layer over the hemispherical grain polysilicon film.

13. A method according to claim 12 further including forming an electrode layer of the dielectric layer.

14. A method according to claim 9 wherein the first temperature is about 500 to 590 degrees C.

15. A method according to claim 9 wherein the first amount of silicon source gas is about 60 to 90 percent of the second amount of silicon source gas.

16. A method for forming a hemispherical grain polysilicon film on an impurity-doped amorphous silicon layer comprising:

a step for forming silicon crystal nuclei on the amorphous silicon layer;

a step for enlarging the silicon crystal nuclei; and a step for annealing the amorphous silicon layer and silicon crystal nuclei.

17. A method according to claim 16 wherein the step for forming silicon crystal nuclei on the amorphous silicon layer includes:

loading the amorphous silicon layer into a chamber; and injecting silicon source gas into the chamber at a first flow rate.

18. A method according to claim 17 wherein the step for enlarging the silicon crystal nuclei includes injecting silicon source gas into the chamber at a second flow rate.

* * * * *